United States Patent
Hsu

(10) Patent No.: US 7,829,981 B2
(45) Date of Patent: Nov. 9, 2010

(54) SEMICONDUCTOR DEVICE PACKAGES WITH ELECTROMAGNETIC INTERFERENCE SHIELDING

(75) Inventor: Chain-Hau Hsu, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 24 days.

(21) Appl. No.: 12/423,607

(22) Filed: Apr. 14, 2009

(65) Prior Publication Data

US 2010/0013064 A1 Jan. 21, 2010

Related U.S. Application Data

(60) Provisional application No. 61/082,313, filed on Jul. 21, 2008.

(51) Int. Cl.
*H01L 23/552* (2006.01)
(52) U.S. Cl. .............. 257/660; 257/659; 257/E21.499; 438/118
(58) Field of Classification Search .............. 257/659, 257/660, E23.114, E21.499; 438/118
See application file for complete search history.

(56) References Cited

U.S. PATENT DOCUMENTS

| | | | |
|---|---|---|---|
| 4,569,786 A | 2/1986 | Deguchi | |
| 4,814,205 A | 3/1989 | Arcilesi et al. | |
| 5,355,016 A | 10/1994 | Swirbel et al. | |
| 5,557,142 A | 9/1996 | Gilmore et al. | |
| 5,677,511 A | 10/1997 | Taylor et al. | |
| 5,886,876 A * | 3/1999 | Yamaguchi | 361/767 |
| 6,376,769 B1 | 4/2002 | Chung | |
| 6,686,649 B1 | 2/2004 | Matthews et al. | |
| 6,740,959 B2 | 5/2004 | Alcoe et al. | |
| 6,881,896 B2 * | 4/2005 | Ebihara | 174/546 |
| 7,045,385 B2 | 5/2006 | Kim et al. | |
| 7,161,252 B2 | 1/2007 | Tsuneoka et al. | |
| 7,187,060 B2 | 3/2007 | Usui | |
| 7,327,015 B2 * | 2/2008 | Yang et al. | 257/660 |
| 7,342,303 B1 | 3/2008 | Berry et al. | |
| 2004/0020673 A1 | 2/2004 | Mazurkiewicz | |
| 2004/0231872 A1 | 11/2004 | Arnold et al. | |
| 2005/0013082 A1 | 1/2005 | Kawamoto et al. | |
| 2005/0045358 A1 | 3/2005 | Arnold | |

(Continued)

FOREIGN PATENT DOCUMENTS

JP 08-288686 1/1996

(Continued)

*Primary Examiner*—Roy K Potter
(74) *Attorney, Agent, or Firm*—Cooley LLP

(57) ABSTRACT

Described herein are semiconductor device packages with EMI shielding and related methods. In one embodiment, a semiconductor device package includes: (1) a substrate unit defining a cut-out portion disposed adjacent to a periphery of the substrate unit; (2) a grounding element disposed in the cut-out portion and at least partially extending between an upper surface and a lower surface of the substrate unit; (3) a semiconductor device disposed adjacent to the upper surface of the substrate unit and electrically connected to the substrate unit; (4) a package body disposed adjacent to the upper surface of the substrate unit and covering the semiconductor device and the grounding element; and (5) an EMI shield disposed adjacent to exterior surfaces of the package body. The EMI shield is electrically connected to a connection surface of the grounding element, such that the grounding element provides an electrical pathway to ground electromagnetic emissions incident upon the EMI shield.

20 Claims, 7 Drawing Sheets

U.S. PATENT DOCUMENTS

2006/0145361 A1 7/2006 Yang et al.
2008/0042301 A1 2/2008 Yang et al.
2008/0061407 A1 3/2008 Yang et al.
2008/0174013 A1 7/2008 Yang et al.

FOREIGN PATENT DOCUMENTS

WO    WO 2004/060034 A1    7/2004

* cited by examiner

SEMICONDUCTOR DEVICE PACKAGES WITH ELECTROMAGNETIC INTERFERENCE SHIELDING

CROSS REFERENCE TO RELATED APPLICATION

This application claims the benefit of U.S. Provisional Application Ser. No. 61/082,313, filed on Jul. 21, 2008, the disclosure of which is incorporated herein by reference in its entirety.

FIELD OF THE INVENTION

The invention relates generally to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

One aspect of the invention relates to semiconductor device packages with EMI shielding. In one embodiment, a semiconductor device package includes: (1) a substrate unit including an upper surface, a lower surface, and a lateral surface disposed adjacent to a periphery of the substrate unit, the substrate unit defining a cut-out portion disposed adjacent to the periphery of the substrate unit; (2) a grounding element disposed in the cut-out portion and at least partially extending between the upper surface and the lower surface of the substrate unit, the grounding element including a connection surface disposed adjacent to the lateral surface of the substrate unit; (3) a semiconductor device disposed adjacent to the upper surface of the substrate unit and electrically connected to the substrate unit; (4) a package body disposed adjacent to the upper surface of the substrate unit and covering the semiconductor device and the grounding element, such that the connection surface of the grounding element is electrically exposed, the package body including exterior surfaces that include a lateral surface, the lateral surface of the package body being substantially aligned with the lateral surface of the substrate unit; and (5) an electromagnetic interference shield disposed adjacent to the exterior surfaces of the package body and electrically connected to the connection surface of the grounding element. The grounding element provides an electrical pathway to ground electromagnetic emissions incident upon the electromagnetic interference shield.

In another embodiment, the semiconductor device package includes: (1) a substrate unit including a first surface and a second opposing surface; (2) a grounding element at least partially extending between the first surface and the second opposing surface, the grounding element corresponding to a remnant of a grounding post and including a connection surface disposed adjacent to a periphery of the substrate unit; (3) a semiconductor device disposed adjacent to the first surface of the substrate unit and electrically connected to the substrate unit; (4) a package body disposed adjacent to the first surface of the substrate unit and covering the semiconductor device and the grounding element, such that the connection surface of the grounding element is electrically exposed, the package body including exterior surfaces; and (5) an electromagnetic interference shield disposed adjacent to the exterior surfaces of the package body and electrically connected to the connection surface of the grounding element. The grounding element provides an electrical pathway to ground electromagnetic emissions incident upon the electromagnetic interference shield.

Another aspect of the invention relates to methods of forming semiconductor device packages with EMI shielding. In one embodiment, a method includes: (1) providing a substrate including an upper surface, a lower surface, and apertures at least partially extending between the upper surface and the lower surface; (2) electrically connecting a semiconductor device to the upper surface of the substrate; (3) applying an electrically conductive material to the apertures to form grounding posts disposed in respective ones of the apertures; (4) applying a molding material to the upper surface of the substrate to form a molded structure covering the grounding posts and the semiconductor device; (5) forming cutting slits extending through the molded structure and the substrate, the cutting slits being aligned with the substrate, such that: (a) the substrate is sub-divided to form a substrate unit; (b) the molded structure is sub-divided to form a package body disposed adjacent to the substrate unit, the package body including exterior surfaces; and (c) remnants of the grounding posts correspond to grounding elements disposed adjacent to a periphery of the substrate unit, each of the grounding elements including an exposed connection surface; and (6) forming an electromagnetic interference shield adjacent to the exterior surfaces of the package body and the connection surfaces of the grounding elements.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, the terms "inner," "outer," "upper," "upwardly," "lower," "downwardly," "vertical," "lateral," and "laterally" refer to a relative orientation of a set of components, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
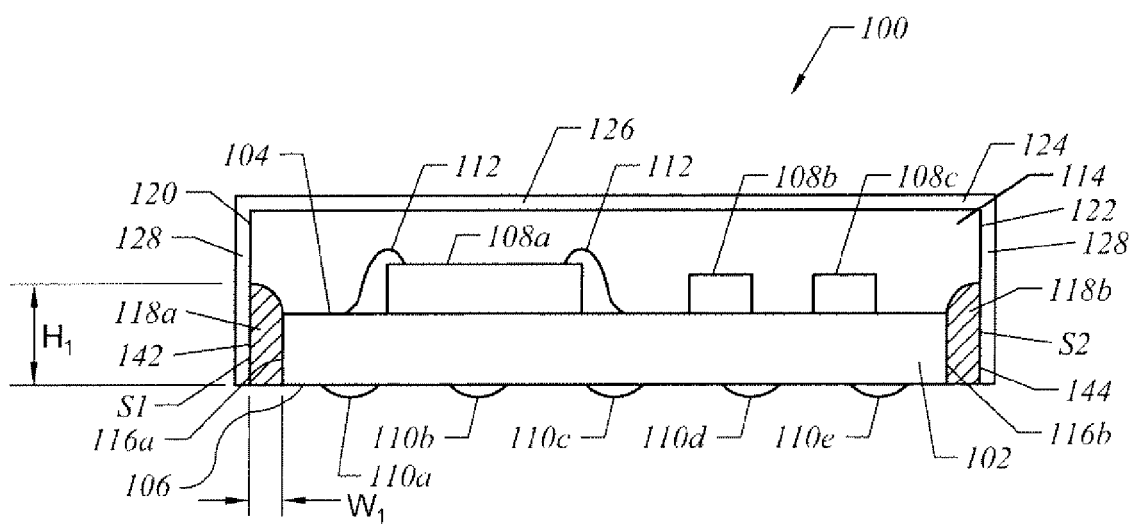
FIG. 1 illustrates a cross-sectional view of a semiconductor device package implemented in accordance with an embodiment of the invention.

Attention first turns to FIG. 1, which illustrates a cross-sectional view of a semiconductor device package 100 implemented in accordance with an embodiment of the invention. In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured.

Referring to FIG. 1, the package 100 includes a substrate unit 102, which includes an upper surface 104, a lower surface 106, and lateral surfaces 142 and 144 disposed adjacent to sides of the substrate unit 102. In the illustrated embodiment, the lateral surfaces 142 and 144 are substantially planar and have a substantially orthogonal orientation with respect to the upper surface 104 or the lower surface 106, although it is contemplated that the shapes and orientations of the lateral surfaces 142 and 144 can vary for other implementations. The substrate unit 102 can be implemented in any of a number of ways, and includes electrical interconnect to provide electrical pathways between the upper surface 104 and the lower surface 106 of the substrate unit 102. The electrical interconnect can include, for example, a set of electrically conductive layers that are incorporated within a set of dielectric layers. The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 102 can include a substantially slab-shaped core that is sandwiched by one set of electrically conductive layers disposed adjacent to an upper surface of the core and another set of electrically conductive layers disposed adjacent to a lower surface of the core. For certain implementations, a thickness of the substrate unit 102, namely a distance between the upper surface 104 and the lower surface 106 of the substrate unit 102, can be in the range of about 0.3 millimeter ("mm") to about 3 mm, such as from about 1.5 mm to about 2.5 mm or from about 1.7 mm to about 2.3 mm. While not illustrated in FIG. 1, it is contemplated that a solder mask layer can be disposed adjacent to either, or both, the upper surface 104 and the lower surface 106 of the substrate unit 102.

In the illustrated embodiment, the substrate unit 102 has cut-out portions 116a and 116b that are disposed adjacent to a periphery of the substrate unit 102, and that extend between the upper surface 104 and the lower surface 106 of the substrate unit 102. Grounding elements 118a and 118b are disposed in respective ones of the cut-out portions 116a and 116b. More particularly, the grounding elements 118a and 118b are disposed substantially at the periphery of the substrate unit 102, and are disposed adjacent to the lateral surfaces 142 and 144, respectively. The grounding elements 118a and 118b are connected to electrical interconnect included in the substrate unit 102 and, as further described below, provide electrical pathways to reduce EMI. As illustrated in FIG. 1i the grounding elements 118a and 118b substantially fill cavities defined by the cut-out portions 116a and 116b, and are implemented as elongated structures and, more particularly, as remnants of grounding posts in accordance with a set of singulation operations as further described below. Referring to FIG. 1, each of the grounding elements 118a and 118b includes a lower end substantially aligned or coplanar with the lower surface 106 of the substrate unit 102 and an upper end extending upwardly beyond the upper surface 104 of the substrate unit 102. However, it is contemplated that the extent of the grounding elements 118a and 118b can vary for other implementations.

The grounding elements 118a and 118b include connection surfaces S1 and S2, respectively, which are lateral surfaces that face away from an interior of the package 100 and are electrically exposed substantially at the periphery of the substrate unit 102. As illustrated in FIG. 1, the connection surfaces S1 and S2 are substantially planar and have a substantially orthogonal orientation with respect to the upper surface 104 or the lower surface 106, although it is contemplated that the connection surfaces S1 and S2 can be curved, inclined, stepped, or roughly textured for other implementations. Also, the connection surfaces S1 and S2 are substantially aligned or co-planar with the lateral surfaces 142 and 144, respectively. The grounding elements 118a and 118b are formed from a metal, a metal alloy, a matrix with a metal or a metal alloy dispersed therein, or another suitable electrically conductive material. For certain implementations, a height $H_1$ of the grounding elements 118a and 118b, namely a vertical extent of the grounding elements 118a and 118b, can be in the range of about 0.5 mm to about 3.2 mm, such as from about 1.7 mm to about 2.7 mm or from about 1.9 mm to about 2.5 mm, and a width $W_1$ of the grounding elements 118a and 118b, namely a lateral extent of the grounding elements 118a and 118b, can be in the range of about 0.05 mm to about 1.5 mm, such as from about 0.1 mm to about 0.7 mm or from about 0.1 mm to about 0.4 mm. An area of each of the connection surfaces S1 and S2 can be in the range of about 0.2 $mm^2$ to about 10 $mm^2$, such as from about 0.9 $mm^2$ to about 4.1 $mm^2$ or from about 1.3 $mm^2$ to about 3.3 $mm^2$. Advantageously, the relatively large areas of the connection surfaces S1 and S2 can enhance reliability and efficiency of electrical connections for reducing EMI.

As illustrated in FIG. 1, the package 100 also includes semiconductor devices 108a, 108b, and 108c, which are disposed adjacent to the upper surface 104 of the substrate unit 102, and electrical contacts 110a, 110b, 110c, 110d, and 110e, which are disposed adjacent to the lower surface 106 of the substrate unit 102. The semiconductor device 108a is wire-bonded to the substrate unit 102 via a set of wires 112, which is formed from gold or another suitable electrically conductive material, and the semiconductor devices 108b and 108c are surface mounted to the substrate unit 102. In the illustrated embodiment, the semiconductor device 108a is a semiconductor chip, while the semiconductor devices 108b and 108c are passive devices, such as resistors, capacitors, or inductors. The electrical contacts 110a, 110b, 110c, 110d, and 110e provide input and output electrical connections for the package 100, and at least a subset of the electrical contacts 110a, 110b, 110c, 110d, and 110e are electrically connected to the semiconductor devices 108a, 108b, and 108c via electrical interconnect included in the substrate unit 102. In the illustrated embodiment, at least one of the electrical contacts 110a, 110b, 110c, 110d, and 110e is a ground electrical contact, and is electrically connected to the grounding elements 118a and 118b via electrical interconnect included in the substrate unit 102. While three semiconductor devices are illustrated in FIG. 1, it is contemplated that more or less semiconductor devices can be included for other implementations, and that semiconductor devices, in general, can be any active devices, any passive devices, or combinations thereof. It is also contemplated that the number of electrical contacts can vary from that illustrated in FIG. 1.

Still referring to FIG. 1, the package 100 also includes a package body 114 that is disposed adjacent to the upper surface 104 of the substrate unit 102, and, in conjunction with the substrate unit 102, the package body 114 substantially covers or encapsulates the grounding elements 118a and 118b, the semiconductor devices 108a, 108b, and 108c and the wires 112 to provide mechanical stability as well as protection against oxidation, humidity, and other environmental conditions. The package body 114 is formed from a molding material, and includes exterior surfaces, including lateral surfaces 120 and 122 disposed adjacent to sides of the package body 114. In the illustrated embodiment, the lateral surfaces 120 and 122 are substantially planar and have a substantially orthogonal orientation with respect to the upper surface 104 or the lower surface 106, although it is contemplated that the lateral surfaces 120 and 122 can be curved, inclined, stepped, or roughly textured for other implementations. Also, the lateral surfaces 120 and 122 are substantially aligned or co-planar with the lateral surfaces 142 and 144, respectively, and also are substantially aligned or co-planar with the connection surfaces S1 and S2, respectively. More particularly, this alignment is accomplished while allowing the connection surfaces S1 and S2 to be electrically exposed, such as by reducing or minimizing coverage of the connection surfaces S1 and S2 by the package body 114. For other implementations, it is contemplated that the shape of the lateral surfaces 120 and 122 and their alignment with the lateral surfaces S1 and S2 can be varied from that illustrated in FIG. 1, while allowing the lateral surfaces S1 and S2 to be at least partially electrically exposed.

The package 100 further includes an EMI shield 124 that is disposed adjacent to the exterior surfaces of the package body 114, the connection surfaces S1 and S2 of the grounding elements 118a and 118b, and the lateral surfaces 142 and 144 of the substrate unit 102. The EMI shield 124 is formed from an electrically conductive material, and substantially surrounds the semiconductor devices 108a, 108b, and 108c within the package 100 to provide protection against EMI. In the illustrated embodiment, the EMI shield 124 includes an upper portion 126 and a lateral portion 128, which extends around substantially the entire periphery of the package body 114 and defines the orthogonal lateral profile of the package 100. As illustrated in FIG. 1, the lateral portion 128 extends downwardly from the upper portion 126 and along the lateral surfaces 142 and 144 of the substrate unit 102, and includes a lower end that is substantially aligned or co-planar with the lower surface 106 of the substrate unit 102. However, it is contemplated that the extent of the lateral portion 128 and the alignment of its lower end with the lower surface 106 can be varied for other implementations.

As illustrated in FIG. 1, the EMI shield 124 is electrically connected to the grounding elements 118a and 118b via the connection surfaces S1 and S2. When electromagnetic emissions radiated from an interior of the package 100 strike the EMI shield 124, at least a portion of these emissions can be efficiently grounded via the grounding elements 118a and 118b, thereby reducing the level of emissions that can pass through the EMI shield 124 and adversely affect neighboring semiconductor devices. Similarly, when electromagnetic emissions from a neighboring semiconductor device strike the EMI shield 124, a similar grounding can occur to reduce EMI of the semiconductor devices 108a, 108b, and 108c within the package 100. During operation, the package 100 can be disposed on a printed circuit board ("PCB") and electrically connected to the PCB via the electrical contacts 110a, 110b, 110c, 110d, and 110e. As previously described, at least one of the electrical contacts 110a, 110b, 110c, 110d, and 110e is a ground electrical contact, and the ground electrical contact can be electrically connected to a ground voltage provided by the PCB. Grounding of electromagnetic emissions incident upon the EMI shield 124 can occur through an electrical pathway including the grounding elements 118a and 118b, electrical interconnect included in the substrate unit 102, and the ground electrical contact. Because the lower ends of the grounding elements 118a and 118b are substantially aligned with the lower surface 106 of the substrate unit 102, these lower ends also can be electrically connected to a ground voltage provided by the PCB, thereby providing an alternative electrical pathway for grounding undesired electromagnetic emissions.

In the illustrated embodiment, the EMI shield 124 is a conformal shield that is formed as a set of coatings, layers, or films. Advantageously, the EMI shield 124 can be formed adjacent to and in direct contact with an exterior of the package IGO without the use of an adhesive, thereby enhancing reliability and resistance to temperature, humidity, and other environmental conditions. Also, the conformal characteristics of the EMI shield 124 allow similar EMI shields and similar manufacturing operations to be readily applied to semiconductor device packages of different sizes and shapes, thereby reducing manufacturing cost and time to accommodate the different packages. For certain implementations, a thickness of the EMI shield 124 can be in the range of about 1 micrometer ("μm") to about 500 μm, such as from about 1 μm to about 200 μm, from about 1 μm to about 100 μm, from about 10 μm to about 100 μm, from about 1 μm to about 50 μm, or from about 1 μm to about 10 μm. Such reduced thickness of the EMI shield 124, relative to a typical easing, allows a reduced overall package size, and is a further advantage of the illustrated embodiment.

Figure 2:
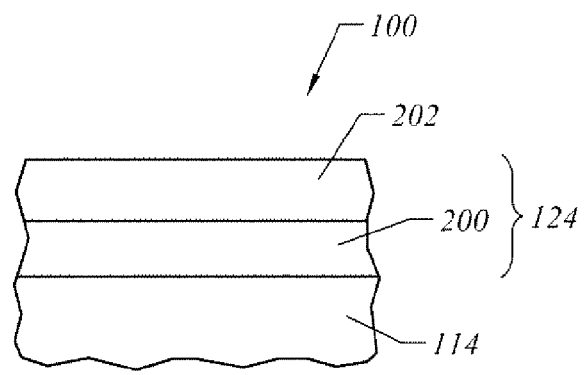
FIG. 2 illustrates an enlarged, cross-sectional view of a portion of the semiconductor device package of FIG. 1.

Attention next turns to FIG. 2, which illustrates an enlarged, cross-sectional view of a portion of the package 100 of FIG. 1. In particular, FIG. 2 illustrates a particular implementation of the EMI shield 124 that is disposed adjacent to the package body 114.

As illustrated in FIG. 2, the EMI shield 124 is multi-layered and includes all inner layer 200, which is disposed adjacent to the package body 114, and an outer layer 202, which is disposed adjacent to the inner layer 200 and is exposed at the exterior of the package 100. In general, each of the inner layer 200 and the outer layer 202 can be formed from a metal, a metal alloy, a matrix with a metal or a metal alloy dispersed therein, or another suitable electrically conductive material. For example, each of the inner layer 200 and the outer layer 202 can be formed from aluminum, copper, chromium, tin, gold, silver, nickel, stainless steel, or combinations thereof. The inner layer 200 and the outer layer 202 can be formed from the same electrically conductive material or different electrically conductive materials. For example, a metal, such as nickel, can be selected for both the inner layer 200 and the outer layer 202. In some instances, different electrically conductive materials can be selected for the inner layer 200 and the outer layer 202 to provide complementary functionalities. For example, a metal with a higher electrical conductivity, such as aluminum, copper, gold, or silver, can be selected for the inner layer 200 to provide EMI shielding functionality. On the other hand, a metal with a somewhat lower electrical conductivity, such as nickel, can be selected for the outer layer 202 to protect the inner layer 200 against oxidation, humidity, and other environmental conditions. In this case, the outer layer 202 also call contribute to the EMI shielding functionality, while providing the protection functionality. While two layers are illustrated in FIG. 2, it is contemplated that more or less layers can be included for other implementations.

Figure 3:
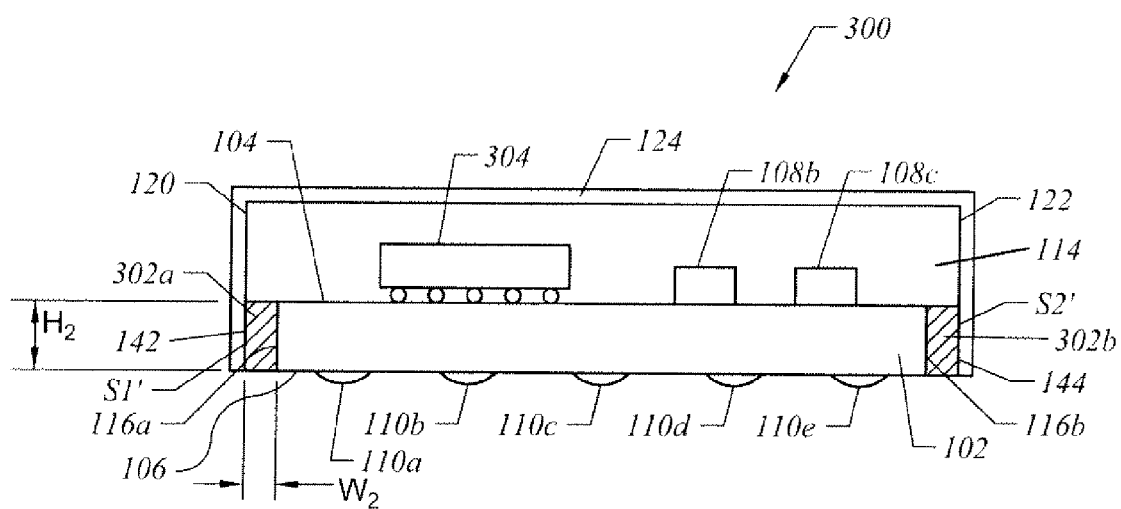
FIG. 3 illustrates a cross-sectional view of a semiconductor device package implemented in accordance with another embodiment of the invention.

FIG. 3 illustrates a cross-sectional view of a semiconductor device package 300 implemented in accordance with another embodiment of the invention. Certain aspects of the package 300 are implemented in a similar manner as previously described for the package 100 of FIG. 1 and, thus, are not further described herein.

Referring to FIG. 3, the package 300 includes grounding elements 302a and 302b, which are disposed in respective ones of the cut-out portions 116a and 116b of the substrate unit 102. The grounding elements 302a and 302b substantially fill cavities defined by the cut-out portions 116a and 116b, and are implemented as remnants of grounding posts each having a lower end substantially aligned or co-planar with the lower surface 106 of the substrate unit 102. In the illustrated embodiment, each of the grounding elements 302a and 302b also has an upper end that is substantially aligned or co-planar with the upper surface 104 of the substrate unit 102. However, it is contemplated that the extent of the grounding elements 302a and 302b can vary for other implementations. For certain implementations, a height $H_2$ of the grounding elements 302a and 302b can substantially match the thickness of the substrate unit 102, and can be in the range of about 0.3 mm to about 3 mm, such as from about 1.5 mm to about 2.5 mm or from about 1.7 mm to about 2.3 mm. A width $W_2$ of the grounding elements 302a and 302b can be in the range of about 0.05 mm to about 1.5 mm, such as from about 0.1 mm to about 0.7 mm or from about 0.1 mm to about 0.4 mm. An area of each connection surface S1' or S2' can be in the range of about 0.1 mm$^2$ to about 9 mm$^2$ such as from about 0.8 mm$^2$ to about 3.8 mm$^2$ or from about 1.2 mm$^2$ to about 3 mm$^2$.

Advantageously, the relatively large areas of the connection surfaces S1' and S2' can enhance reliability and efficiency of electrical connections for reducing EMI.

As illustrated in FIG. 3, the package 300 also includes a semiconductor device 304, which is a semiconductor chip that is disposed adjacent to the upper surface 104 of the substrate unit 102. In the illustrated embodiment, the semiconductor device 304 is flip chip-bonded to the substrate unit 102, such as via a set of solder bumps. It is contemplated that the semiconductor device 304 can be electrically connected to the substrate unit 102 in another manner, such as by wire-bonding.

FIG. 4A through FIG. 4F illustrate a method of forming a semiconductor device package, according to an embodiment of the invention. For ease of presentation, the following manufacturing operations are described with reference to the package 100 of FIG. 1. However, it is contemplated that the manufacturing operations can be used to form other semiconductor device packages, such as the package 300 of FIG. 3.

Figure 4A:
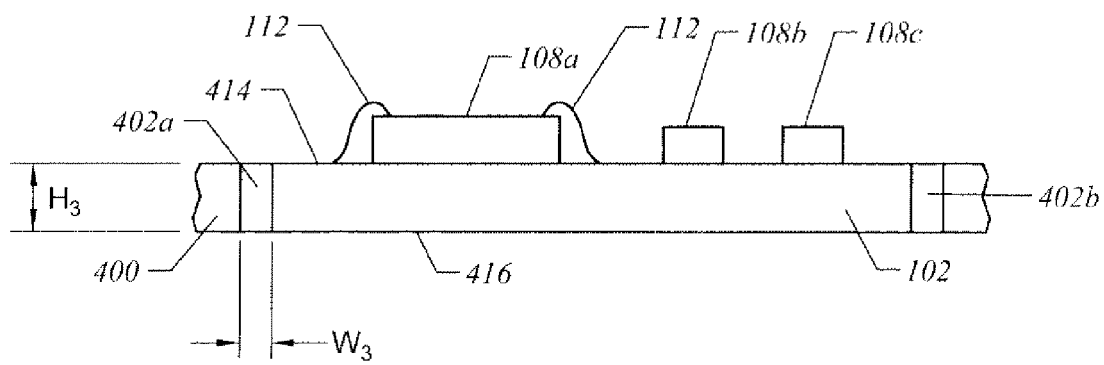
FIG. 4A through FIG. 4F illustrate a method of forming the semiconductor device package of FIG. 1, according to an embodiment of the invention.

Referring first to FIG. 4A, a substrate 400 is provided. The substrate 400 includes the substrate unit 102 and apertures 402a and 402b that are disposed adjacent to the periphery of the substrate unit 102. As illustrated in FIG. 4A, the apertures 402a and 402b are implemented as channels or holes that extend between an upper surface 414 of the substrate 400 and a lower surface 416 of the substrate 400. However, it is contemplated that the extent of the apertures 402a and 402b can vary for other implementations. In the illustrated embodiment, the apertures 402a and 402b are shaped in the form of circular cylindrical channels, including substantially circular openings adjacent to the upper surface 414 and the lower surface 416. It is contemplated that the shape of the apertures 402a and 402b, in general, can be any of a number of shapes, including other types of cylindrical shapes, such as an elliptic cylindrical shape, a square cylindrical shape, and a rectangular cylindrical shape, and non-cylindrical shapes, such as cone, funnel, and other tapered shapes. It is also contemplated that lateral boundaries of the apertures 402a and 402b can be curved or roughly textured. For certain implementations, a height $H_3$ of the apertures 402a and 402b can substantially match the thickness of the substrate unit 102, and can be in the range of about 0.3 mm to about 3 mm, such as from about 1.5 mm to about 2.5 mm or from about 1.7 mm to about 2.3 mm. A width $W_3$ of the apertures 402a and 402b can be in the range of about 0.3 mm to about 3 mm such as from about 0.5 mm to about 1.5 mm or from about 0.7 mm to about 1.3 mm. If the apertures 402a and 402b have non-uniform cross-sections, the width $W_3$ can correspond to, for example, an average of lateral extents along orthogonal directions. The apertures 402a and 402b can be formed in any of a number of ways, such as by chemical etching, laser drilling, or mechanical drilling.

Figure 5A:
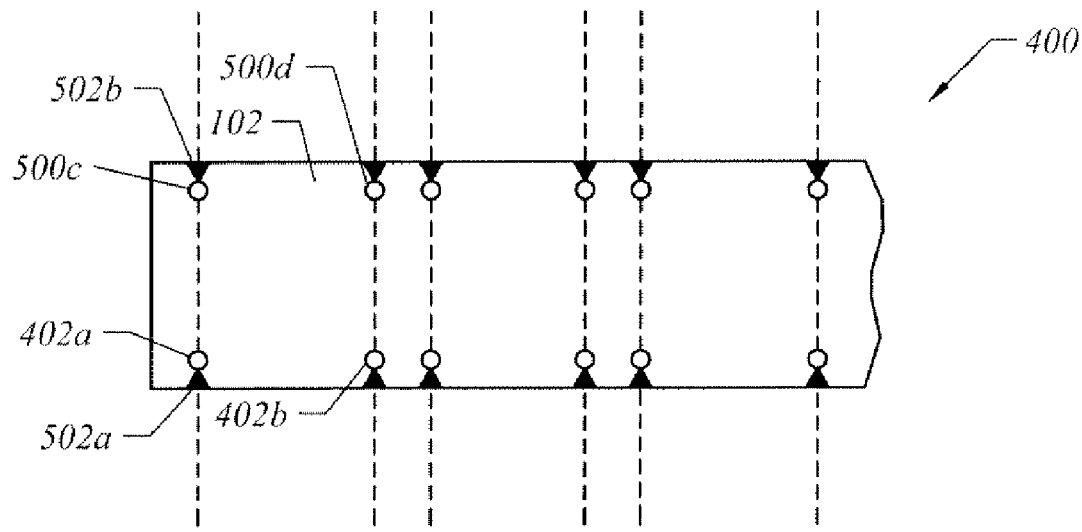
FIG. 5A and FIG. 5B illustrate top views of two implementations of a substrate that can be used to form the semiconductor device package of FIG. 1, according to an embodiment of the invention.
Figure 5B:
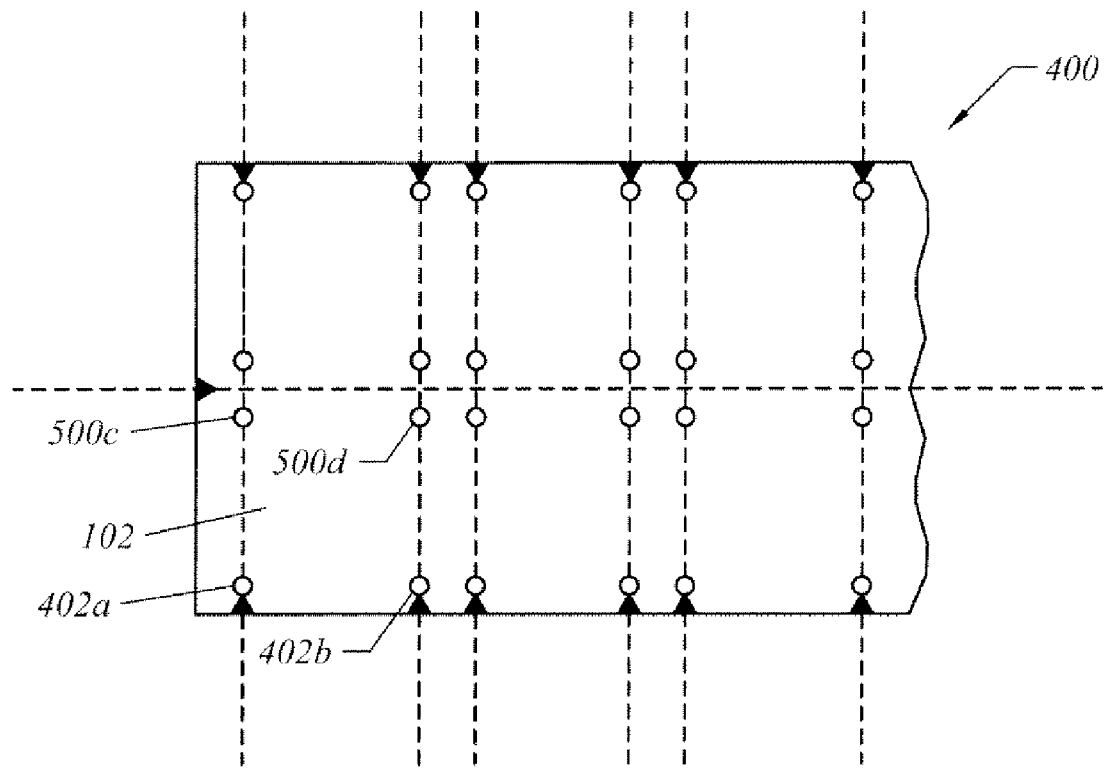

To enhance manufacturing throughput, the substrate 400 includes multiple substrate units to allow certain of the manufacturing operations to be readily performed in parallel or sequentially. FIG. 5A and FIG. 5B illustrate top views of two implementations of the substrate 400, according to an embodiment of the invention. FIG. 5A illustrates a strip-type implementation of the substrate 400, in which multiple substrate units, including the substrate unit 102, are arranged sequentially in a linear fashion while FIG. 5B illustrates an array-type implementation of the substrate 400, in which multiple substrate units are arranged in a two-dimensional fashion. In the illustrated embodiment, four apertures are disposed adjacent to a periphery of each substrate unit. For example, the apertures 402a and 402b, along with apertures 500c and 500d, are disposed adjacent to respective corners of the substrate unit 102. However, it is contemplated that the number of apertures and their positioning with respect to each substrate unit can vary for other implementations. For both implementations illustrated in FIG. 5A and FIG. 5B, fiducial marks, such as fiducial marks 502a and 502b, are included adjacent to a periphery of the substrate 400 to allow proper orientation and positioning of the substrate 400 during manufacturing. In particular and as further described below, these fiducial marks allow proper positioning of the substrate 400 during singulation.

Turning back to FIG. 4A, once the substrate 400 is provided, the semiconductor devices 108a, 108b, and 108c are disposed adjacent to the upper surface 414 of the substrate 400, and are electrically connected to the substrate unit 102. In particular, the semiconductor device 108a is wire-bonded to the substrate unit 102 via the wires 112, and the semiconductor devices 108b and 108c are surface mounted to the substrate unit 102.

Next, as illustrated in FIG. 4X, the substrate 400 along with the semiconductor devices 108a, 108b, and 108c are inverted, and an electrically conductive material 404 is applied to and drawn into the apertures 402a and 402b. The electrically conductive material 404 can include a metal, a metal alloy, a matrix with a metal or a metal alloy dispersed therein, or another suitable electrically conductive material. For example, the electrically conductive material 404 can include a solder, which can be formed from any of a number of fusible metal alloys having melting points in the range of about 90° C. to about 450° C. Examples of such fusible metal alloys include tin-lead alloys, copper-zinc alloys, copper-silver alloys, tin-silver-copper alloys, bismuth-containing alloys, indium-containing alloys, and antimony-containing alloys. As another example, the electrically conductive material 404 can include an electrically conductive adhesive which can be formed from any of a number of resins having an electrically conductive filler dispersed therein. Examples of suitable resins include epoxy-based resins and silicone-based resins, and examples of suitable fillers include silver fillers and carbon fillers.

Figure 4B:
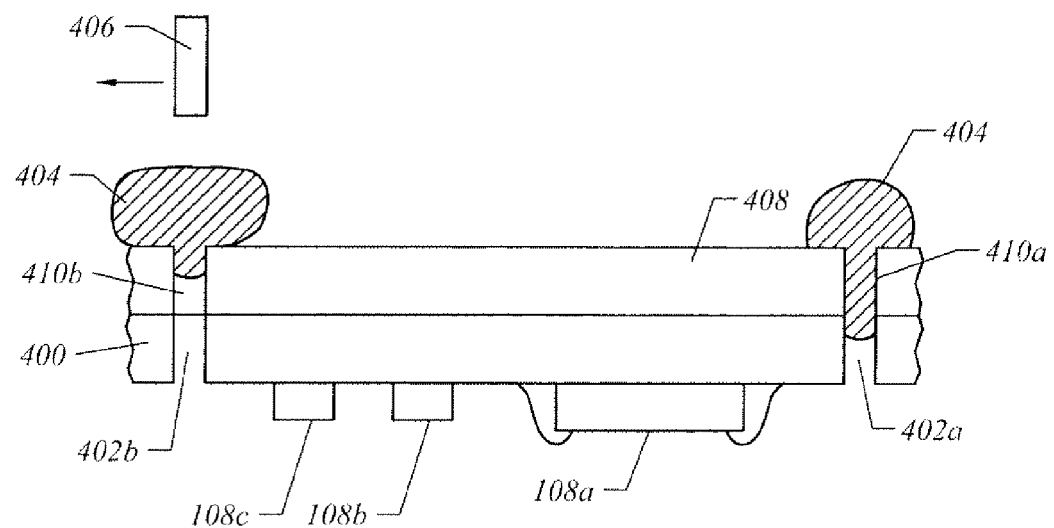

In the illustrated embodiment, a screen-printing technique is used to apply the electrically conductive material 404. In particular, a dispenser 406 is laterally positioned with respect to a stencil 408 that includes apertures 410a and 410b. The apertures 410a and 410b of the stencil 408 are substantially aligned with the apertures 402a and 402b of the substrate 400, thereby allowing the electrically conductive material 404 to be selectively applied to the apertures 402a and 402b. While a single dispenser is illustrated in FIG. 4B, it is contemplated that multiple dispensers can be used to further enhance manufacturing throughput.

Once applied, the electrically conductive material 404 is reflowed, such as by raising the temperature to near or above a melting point of the electrically conductive material 404. As a result of gravity and capillary effects, the electrically conductive material 404 is drawn downwardly into the apertures 402a and 402b, as illustrated in FIG. 4I. Once the electrically conductive material 404 is sufficiently drawn into the apertures 402a and 402b, the electrically conductive material 404 is hardened or solidified, such as by lowering the temperature to below the melting point of the electrically conductive material 404.

Figure 4C:
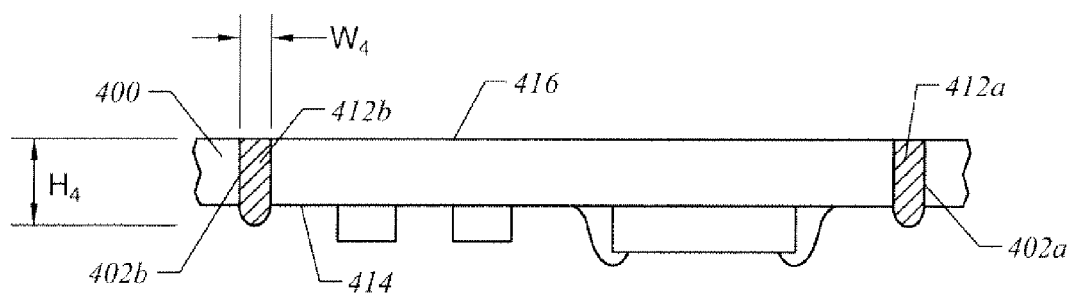
Figure 4D:
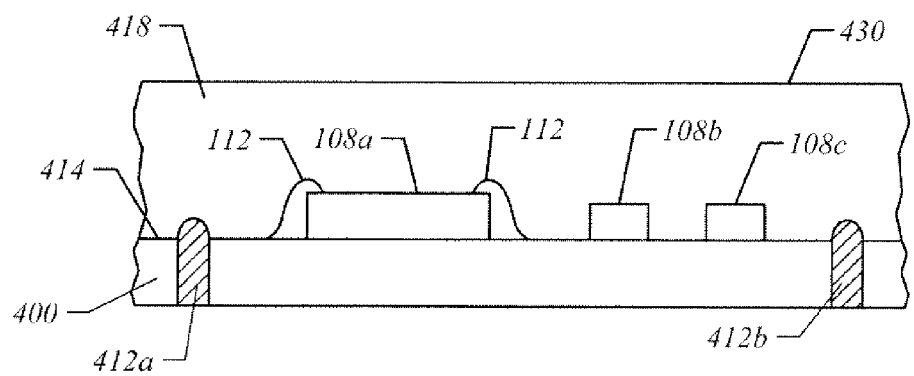

Referring next to FIG. 4C, the solidification operation forms grounding posts 412a and 412b disposed in respective ones of the apertures 402a and 402b. In the illustrated embodiment, the grounding posts 412a and 412b substantially fill cavities defined by the apertures 402a and 402b, and are implemented as elongated structures each including one end substantially aligned or co-planar with the lower surface 416 of the substrate 400 (in its inverted orientation) and another end extending downwardly beyond the upper surface 414 of the substrate 400 (in its inverted orientation). However, it is contemplated that the extent of the grounding posts 412a and 412b can vary for other implementations. For certain implementations, a height $H_4$ of the grounding posts 412a and 412b can be in the range of about 0.5 mm to about 3.2 mm, such as from about 1.7 mm to about 2.7 mm or from about 1.9 mm to about 2.5 mm, and a width $W_4$ of the grounding posts 412a and 412b can be in the range of about 0.3 mm to about 3 mm, such as from about 0.5 mm to about 1.5 mm or from about 0.7 mm to about 1.3 mm. For other implementations (such as when forming the package 300 of FIG. 3), the height $H_4$ of the grounding posts 412a and 412b can be in the range of about 0.3 mm to about 3 mm, such as from about 1.5 mm to about 2.5 mm or from about 1.7 mm to about 2.3 mm, and the width $W_4$ of the grounding posts 412a and 412b can be in the range of about 0.3 mm to about 3 mm, such as from about 0.5 mm to about 1.5 mm or from about 0.7 mm to about 1.3 mm. If the grounding posts 412a and 412b have non-uniform cross-sections, the width $W_4$ Can correspond to, for example, an average of lateral extents along orthogonal directions.

Turning next to FIG. 4I, the substrate 400 along with the semiconductor devices 108a, 108b, and 108c are inverted back to their upright orientation, and a molding material 418 is applied to the upper surface 414 of the substrate 400 so as to substantially cover or encapsulate the grounding posts 412a and 412b, the semiconductor devices 108a, 108b, and 108c, and the wires 112. The molding material 418 can include, for example, a Novolac-based resin, an epoxy-based resin a silicone-based resin, or another suitable encapsulant. Suitable fillers also can be included, such as powdered $SiO_2$. The molding material 418 can be applied using any of a number of molding techniques, such as compression molding, injection molding, and transfer molding. Once applied, the molding material 418 is hardened or solidified, such as by lowering the temperature to below a melting point of the molding material 418, thereby forming a molded structure 430.

Figure 4E:
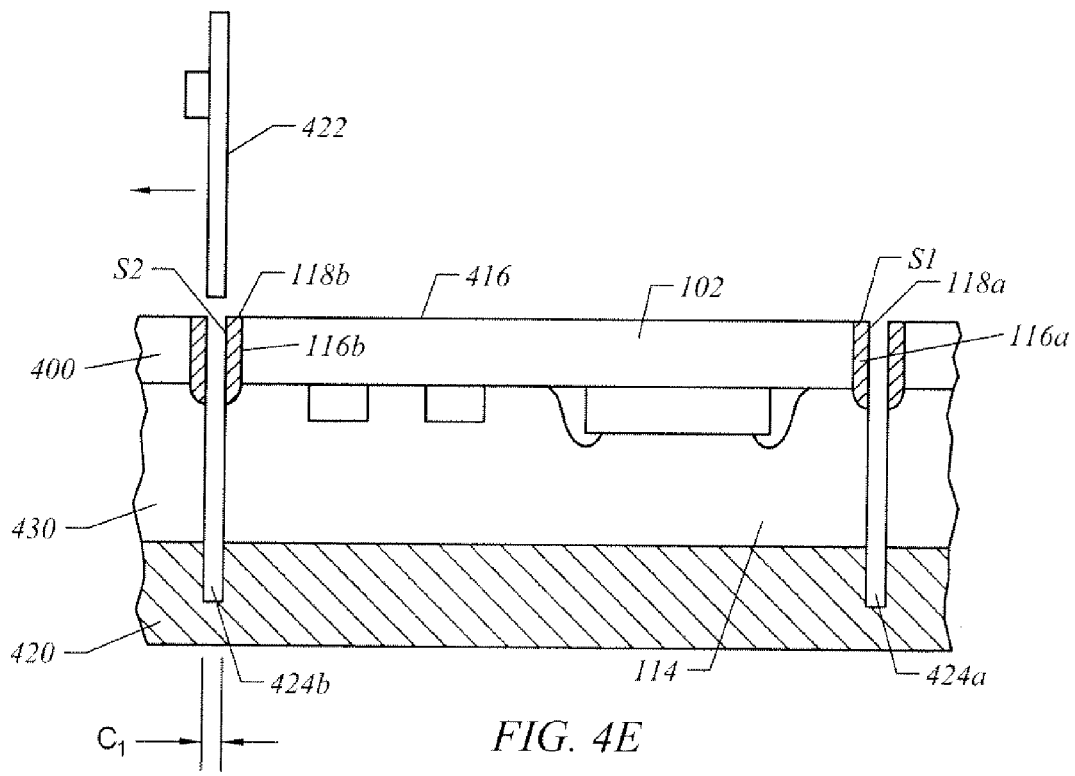

Referring to FIG. 4E, the substrate 400 along with the molded structure 430 are inverted, and then disposed adjacent to a tape 420, which can be implemented as a single-sided or double-sided adhesive tape. Singulation is next performed with respect to the lower surface 416 of the substrate 400 (in its inverted orientation). Such manner of singulation can be referred to as "back-side" singulation. As illustrated in FIG. 4E, the "back-side" singulation is performed using a saw 422, which forms cutting slits 424a and 424b In particular, the cutting slits 424a and 424b extend downwardly and completely through the substrate 400 and the molded structure 430 (in their inverted orientation) and partially through the tape 420, thereby sub-dividing the substrate 400 and the molded structure 430 into discrete units, including the substrate unit 102 and the package body 114. The "back-side" singulation is a "full-cut" singulation, since sub-division of the substrate 400 and the molded structure 430 at each of various locations can occur through one singulation operation, rather than multiple singulation operations, such as multiple "half-cut" singulations. Advantageously, the use of "full-cut" singulation, rather than "half-cut" singulation, enhances manufacturing throughput by reducing the number of singulation operations and the time involved for those operations. Also, manufacturing cost is reduced by enhancing an utilization ratio of the substrate 400, and an overall yield rate is enhanced by reducing the probability of defects resulting from sawing errors. As illustrated in FIG. 4E, the tape 420 secures the substrate unit 102 and the package body 114 with respect to neighboring substrate units and package bodies during the "back-side" singulation.

Still referring to FIG. 4E, the saw 422 is laterally positioned and substantially aligned with each grounding post that is disposed in a respective aperture, such that a resulting cutting slit sub-divides the grounding post into two grounding elements and sub-divides the aperture into two cut-out portions. In such manner, the grounding elements 118a and 118b are formed and are disposed in respective ones of the cut-out portions 116a and 116b. The grounding elements 118a and 118b include the connection surfaces S1 and S2, respectively, which are exposed to the surroundings at the periphery of the substrate unit 102. The alignment of the saw 422 during singulation can be further appreciated with reference to FIG. 5A and FIG. 5B, in which dashed lines correspond to cutting slits to be formed using the saw 422. The fiducial marks, such as the fiducial marks 502a and 502b, allow proper positioning of the saw 422 with respect to the substrate 400 when forming the cutting slits. For certain implementations, a width $C_1$ of each of the cutting slits 424a and 424b (also sometimes referred to as a full-cut width or full-cut sawing street) can be in the range of about 100 µm to about 600 µm, such as from about 200 µm to about 400 µm or from about 250 µm to about 350 µm. However, it is contemplated that the width $C_1$ can vary for other implementations, and, for example, can be adjusted relative to the width $W_4$ of the grounding posts 412a and 412b such that $C_1 < W_4$.

Figure 4F:
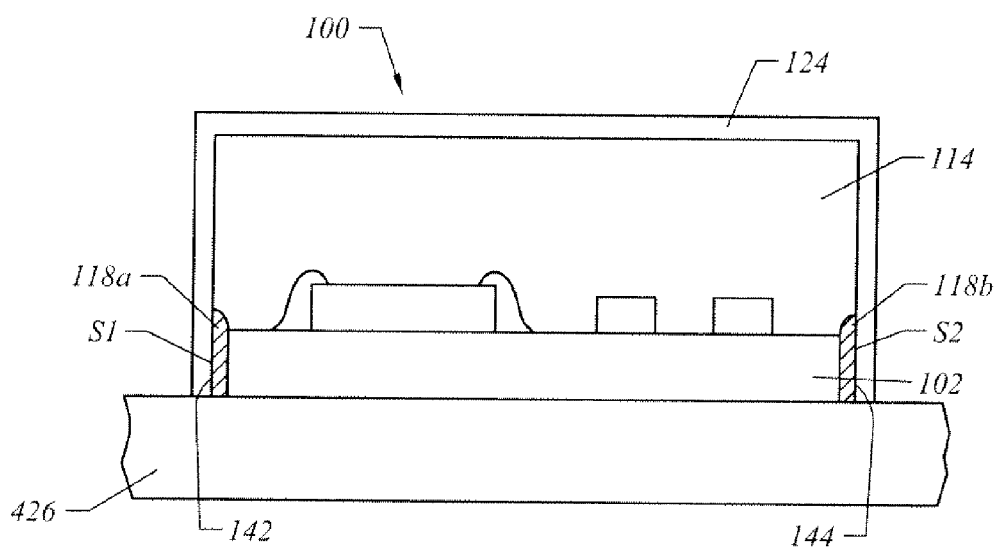

Next, as illustrated in FIG. 4F, the substrate unit 102 along with the package body 114 are inverted back to their upright orientation, and are disposed adjacent to a carrier 426. The EMI shield 124 is then formed adjacent to exposed surfaces, including the exterior surfaces of the package body 114, the connection surfaces S1 and S2 of the grounding elements 118a and 118b, and the lateral surfaces 142 and 144 of the substrate unit 102, thereby resulting in the package 100. The EMI shield 124 can be formed using any of a number of coating techniques, such as by forming a set of layers or films in accordance with chemical vapor deposition, electroless plating, electrolytic plating, printing, spraying, sputtering, and vacuum deposition. For example, the EMI shield 124 can include a single layer that is formed from nickel using electroless plating and with a thickness of at least about 5 µm, such as from about 5 µm to about 50 µm or from about 5 µm to about 10 µm. If the EMI shield 124 is multi-layered, different layers can be formed using the same coating technique or different coating techniques. For example, an inner layer can be formed from copper using electroless plating, and an outer layer can be formed from nickel using either electroless plating or electrolytic plating. As another example, an inner layer (serving as a base layer) can be formed from copper using either sputtering or electroless plating and with a thickness of at least about 1 µm, such as from about 1 µm to about 50 µm or from about 1 µm to about 10 µm, and an outer layer (serving as an anti-oxidation layer) can be formed from stainless steel, nickel, or copper using sputtering and with a thickness no greater than about 1 µm such as from about 0.01 µm to about 1 µm or from about 0.01 µm to about 0.1 µm. In these examples, surfaces to which the EMI shield 124 is applied can be subjected to certain pre-treatment operations to facilitate formation of the inner layer and the outer layer. Examples of such pre-treatment operations include surface roughening, such as by chemical etching or mechanical abrasion, and formation of a seed layer, such as by electroless plating.

Figure 6:
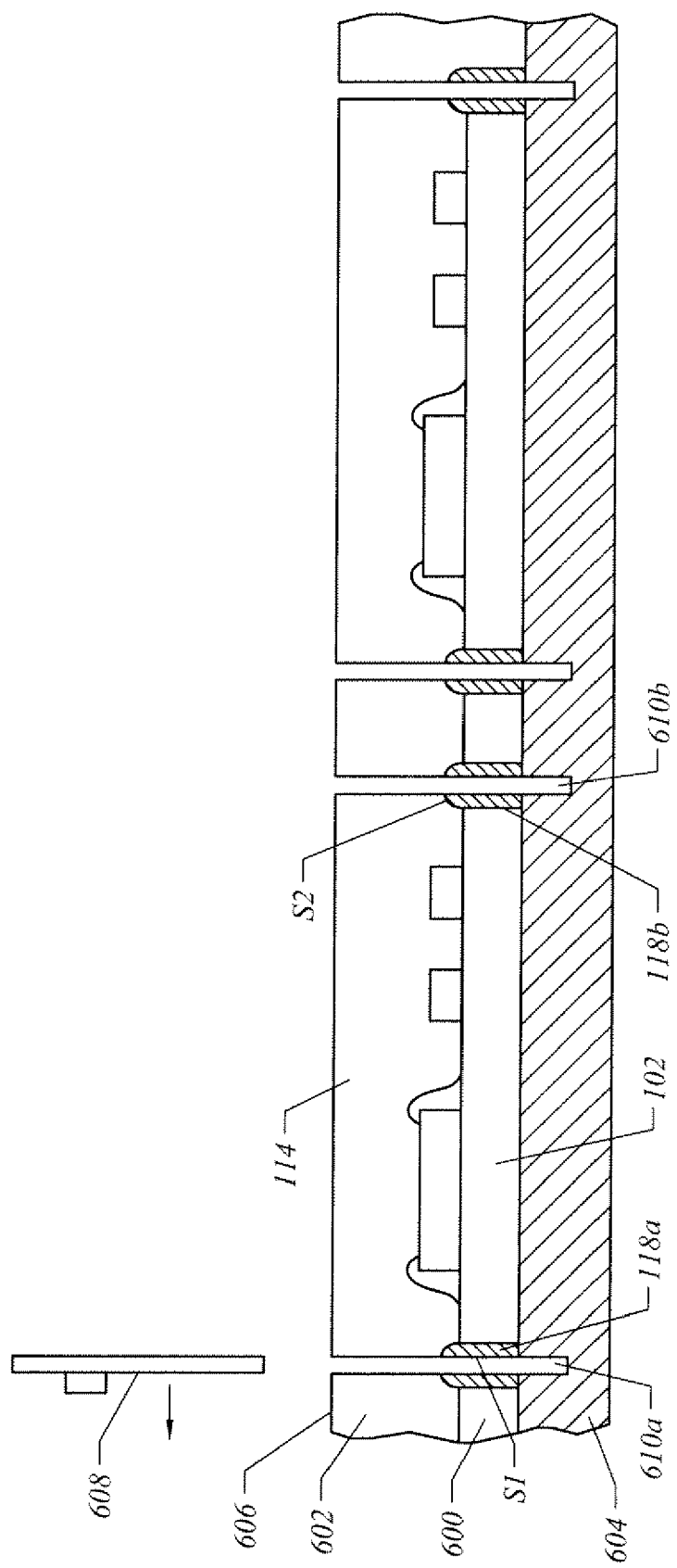
FIG. 6 illustrates a method of forming the semiconductor device package of FIG. 1, according to another embodiment of the invention.

FIG. 6 illustrates a method of forming a semiconductor device package, according to another embodiment of the invention. For ease of presentations the following manufacturing operations are again described with reference to the package 100 of FIG. 1. However, it is contemplated that the manufacturing operations can be used to form other semiconductor device packages, such as the package 300 of FIG. 3. Also, certain aspects of the manufacturing operations are implemented in a similar manner as previously described for FIG. 4A through FIG. 4F and, thus, are not further described herein.

Referring to FIG. 6, a substrate 600 along with a molded structure 602 are disposed adjacent to a tape 604, which can be implemented as a single-sided or double-sided adhesive tape. Singulation is next performed with respect to an upper surface 606 of the molded structure 602 (in its upright orientation). Such manner of singulation can be referred to as "front-side" singulation. As illustrated in FIG. 6, the "front-side" singulation is performed using a saw 608, which forms cutting slits 610a and 610b that extend downwardly and completely through the molded structure 602 and the substrate 600 (in their upright orientation) and partially through the tape 604, thereby sub-dividing the substrate 600 and the molded structure 602 into discrete units, including the substrate unit 102 and the package body 114. The "front-side" singulation is a "full-cut" singulation, since sub-division of the substrate 600 and the molded structure 602 at each of various locations can occur through one singulation operation, rather than multiple singulation operations, such as multiple "half-cut" singulations. In conjunction, the grounding elements 118a and 118b are formed and include the connection surfaces S1 and S2, respectively, which are exposed to the surroundings at the periphery of the substrate unit 102. Advantageously, the tape 604 secures the substrate unit 102 and the package body 114 with respect to neighboring substrate units and package bodies during the "front-side" singulation. Because the substrate units and the package bodies are in their upright orientation, formation of EMI shields can be carried out with those components disposed adjacent to the tape 604, without requiring inversion and transfer to a separate carrier. Accordingly, the "front-side" singulation illustrated in FIG. 6 can be advantageously implemented to further reduce manufacturing cost and time.

While the invention has been described with reference to the specific embodiments thereof, it should be understood by those skilled in the art that various changes may be made and equivalents may be substituted without departing from the true spirit and scope of the invention as defined by the appended claims. In additions, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
    a substrate unit including an upper surface, a lower surface, and a lateral surface disposed adjacent to a periphery of the substrate unit, the substrate unit defining a cut-out portion disposed adjacent to the periphery of the substrate unit;
    a grounding element disposed in the cut-out portion and at least partially extending between the upper surface and the lower surface of the substrate unit, the grounding element including a connection surface disposed adjacent to the lateral surface of the substrate unit;
    a semiconductor device disposed adjacent to the upper surface of the substrate unit and electrically connected to the substrate unit;
    a package body disposed adjacent to the upper surface of the substrate unit and covering the semiconductor device and the grounding element, such that the connection surface of the grounding element is electrically exposed, the package body including exterior surfaces that include a lateral surface, the lateral surface of the package body being substantially aligned with the lateral surface of the substrate unit; and
    an electromagnetic interference shield disposed adjacent to the exterior surfaces of the package body and electrically connected to the connection surface of the grounding element,
    wherein the grounding element provides an electrical pathway to ground electromagnetic emissions incident upon the electromagnetic interference shield.

2. The semiconductor device package of claim 1, wherein the connection surface of the grounding element is substantially aligned with the lateral surface of the substrate unit.

3. The semiconductor device package of claim 1, wherein the connection surface of the grounding element is substantially planar and has a substantially orthogonal orientation with respect to the upper surface of the substrate unit.

4. The semiconductor device package of claim 1, wherein a height of the grounding element is in the range of 0.5 mm to 3.2 mm, and a width of the grounding element is in the range of 0.05 mm to 1.5 mm.

5. The semiconductor device package of claim 1, wherein the electromagnetic interference shield includes a lateral portion that extends along the lateral surface of the substrate unit.

6. The semiconductor device package of claim 5, wherein a lower end of the lateral portion is substantially aligned with the lower surface of the substrate unit.

7. A semiconductor device package, comprising:
    a substrate unit including a first surface and a second opposing surface;
    a grounding element at least partially extending between the first surface and the second opposing surface, the grounding element corresponding to a remnant of a grounding post and including a connection surface disposed adjacent to a periphery of the substrate unit;
    a semiconductor device disposed adjacent to the first surface of the substrate unit and electrically connected to the substrate unit;
    a package body disposed adjacent to the first surface of the substrate unit and covering the semiconductor device and the grounding element, such that the connection surface of the grounding element is electrically exposed, the package body including exterior surfaces; and
    an electromagnetic interference shield disposed adjacent to the exterior surfaces of the package body and electrically connected to the connection surface of the grounding element,
    wherein the grounding element provides an electrical pathway to ground electromagnetic emissions incident upon the electromagnetic interference shield.

8. The semiconductor device package of claim 7, wherein a lateral profile of the semiconductor device package is substantially planar and is substantially orthogonal with respect to the first surface of the substrate unit.

9. The semiconductor device package of claim 7, wherein the grounding element includes at least one of a solder and an electrically conductive adhesive.

10. The semiconductor device package of claim 7, wherein an area of the connection surface is in the range of 0.2 mm² to 10 mm².

11. The semiconductor device package of claim 7, wherein the substrate unit defines a cut-out portion disposed adjacent to the periphery of the substrate unit, and the grounding element is disposed in the cut-out portion.

12. The semiconductor device package of claim 7, wherein the substrate unit further includes a lateral surface extending between the first surface and the second opposing surface, and the connection surface of the grounding element is substantially aligned with the lateral surface of the substrate unit.

13. The semiconductor device package of claim 12, wherein the exterior surfaces of the package body include a lateral surface, and the lateral surface of the package body is substantially aligned with the lateral surface of the substrate unit.

14. The semiconductor device package of claim 7, wherein the electromagnetic interference shield is a conformal shield that includes at least one of aluminum, copper, chromium, tin, gold, silver, stainless steel, and nickel.

15. The semiconductor device package of claim 7, wherein the electromagnetic interference shield includes a first layer and a second layer disposed adjacent to the first layer, and the first layer and the second layer include different electrically conductive materials.

16. A method of forming a semiconductor device package, comprising:
   providing a substrate including an upper surface, a lower surface, and apertures at least partially extending between the upper surface and the lower surface;
   electrically connecting a semiconductor device to the upper surface of the substrate;
   applying an electrically conductive material to the apertures to form grounding posts disposed in respective ones of the apertures;
   applying a molding material to the upper surface of the substrate to form a molded structure covering the grounding posts and the semiconductor device;
   forming cutting slits extending through the molded structure and the substrate, the cutting slits being aligned with the substrate, such that: (a) the substrate is sub-divided to form a substrate unit; (b) the molded structure is sub-divided to form a package body disposed adjacent to the substrate unit, the package body including exterior surfaces; and (c) remnants of the grounding posts correspond to grounding elements disposed adjacent to a periphery of the substrate unit, each of the grounding elements including an exposed connection surface; and
   forming an electromagnetic interference shield adjacent to the exterior surfaces of the package body and the connection surfaces of the grounding elements.

17. The method of claim 16, wherein a height of at least one of the apertures is in the range of 0.3 mm to 3 mm, and a width of at least one of the apertures is in the range of 0.3 mm to 3 mm.

18. The method of claim 16, wherein applying the electrically conductive material includes applying at least one of a solder and an electrically conductive adhesive to the apertures.

19. The method of claim 16, further comprising securing the lower surface of the substrate to a tape, and wherein forming the cutting slits is such that the cutting slits extend partially through the tape.

20. The method of claim 16, further comprising securing an upper surface of the molded structure to a tape, and wherein forming the cutting slits is such that the cutting slits extend partially through the tape.

* * * * *